(12) United States Patent
Chung et al.

(10) Patent No.: US 7,732,933 B2
(45) Date of Patent: Jun. 8, 2010

(54) SEMICONDUCTOR CHIP AND TAB PACKAGE HAVING THE SAME

(75) Inventors: Ye-Chung Chung, Gyeonggi-do (KR); Dong-Han Kim, Gyeonggi-do (KR); Sa-Yoon Kang, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 22 days.

(21) Appl. No.: 11/971,848

(22) Filed: Jan. 9, 2008

(65) Prior Publication Data
US 2008/0128902 A1      Jun. 5, 2008

Related U.S. Application Data

(63) Continuation of application No. 11/261,260, filed on Oct. 28, 2005, now Pat. No. 7,329,597.

(30) Foreign Application Priority Data

Nov. 26, 2004   (KR)   ................. 2004-98010

(51) Int. Cl.
*H01L 29/40* (2006.01)
(52) U.S. Cl. .................... 257/779; 257/772
(58) Field of Classification Search ............... 257/459, 257/E23.02, 772, 779, E23.015, E23.023–E23.079, 257/E21.508–E21.509, E21.519, E23.04; 438/612–617
See application file for complete search history.

(56) References Cited

U.S. PATENT DOCUMENTS

| | | | |
|---|---|---|---|
| 4,862,322 A * | 8/1989 | Bickford et al. | 361/718 |
| 5,162,896 A * | 11/1992 | Takubo et al. | 257/664 |
| 5,866,943 A | 2/1999 | Mertol | |
| 6,054,975 A * | 4/2000 | Kurokawa et al. | 345/100 |
| RE37,539 E * | 2/2002 | Oguchi et al. | 257/686 |
| 6,657,124 B2 | 12/2003 | Ho | |
| 6,914,566 B2 * | 7/2005 | Beard | 343/702 |
| 6,917,098 B1 * | 7/2005 | Yamunan | 257/666 |
| 7,446,844 B2 * | 11/2008 | Hong | 349/152 |

(Continued)

FOREIGN PATENT DOCUMENTS

JP          04-348048          12/1992

(Continued)

OTHER PUBLICATIONS

English language abstract of the Japanese Publication No. 1992-348048.

(Continued)

*Primary Examiner*—Wai-Sing Louie
*Assistant Examiner*—Bilkis Jahan
(74) *Attorney, Agent, or Firm*—Muir Patent Consulting, PLLC

(57) ABSTRACT

A semiconductor chip, having an active surface including a peripheral area and a central area, presents a connection area formed on a portion of the peripheral area. The semiconductor chip includes output pads formed in the peripheral area of the active surface and input pads formed in the central area of the active surface. The input pads may be connected to wiring patterns of a TAB tape passing over the connection area.

20 Claims, 5 Drawing Sheets

U.S. PATENT DOCUMENTS

| | | | |
|---|---|---|---|
| 2001/0025364 A1* | 9/2001 | Kaneko | 716/1 |
| 2003/0193088 A1 | 10/2003 | Hall et al. | |
| 2004/0017008 A1* | 1/2004 | Ueda | 257/734 |
| 2004/0097015 A1* | 5/2004 | Sharma | 438/122 |
| 2004/0108594 A1* | 6/2004 | Toyosawa | 257/734 |
| 2006/0006480 A1* | 1/2006 | Shinozaki et al. | 257/401 |
| 2006/0113648 A1* | 6/2006 | Chung et al. | 257/678 |

FOREIGN PATENT DOCUMENTS

| | | |
|---|---|---|
| JP | 1992-348048 | 12/1992 |
| JP | 08-313925 | 11/1996 |
| JP | 09-244051 | 9/1997 |
| JP | 09-260048 | 10/1997 |
| KR | 2002-0078365 | 10/2002 |

OTHER PUBLICATIONS

English language abstract of the Japanese Publication No. 08-313925.

English language abstract of the Japanese Publication No. 09-244051.

English language abstract of the Japanese Publication No. 09-260048.

English language abstract of the Korean Publication No. 2002-0078365.

* cited by examiner

SEMICONDUCTOR CHIP AND TAB PACKAGE HAVING THE SAME

CROSS REFERENCE TO RELATED APPLICATIONS

This application is a Continuation of U.S. Ser. No. 11/261,260, filed on Oct. 28, 2005, now pending, which claims priority from Korean Patent Application No. 2004-98010, filed on Nov. 26, 2004, all of which are hereby incorporated by reference in their entirety.

BACKGROUND OF THE INVENTION

1. Field of the Invention

The present invention relates to a semiconductor device and, more particularly, to a semiconductor chip and a TAB package therefore.

2. Description of the Related Art

Tape automated bonding (TAB) techniques may employ inner lead bonding (ILB) for inner connections. TAB techniques also may provide a reel-to-reel package assembly using a reel type tape wiring board. A package manufactured by the TAB technique is referred to as a TAB package. The TAB package may include a tape carrier package (TCP) and a chip on board (COB). The TAB package may be thin and have fine pitch. A TAB package may be used in a wide range of applications, examples of which include in a watch, a calculator, a driver IC for a liquid crystal display, and a micro-processor for a personal computer.

FIG. 1 is a plan view of a conventional semiconductor chip 10 for a TAB package. FIG. 2 is a plan view of a conventional TAB package 100 having the semiconductor chip 10 of FIG. 1. FIG. 3 is a cross-sectional view taken along the line of I-I of FIG. 2.

Referring to FIGS. 1 through 3, the semiconductor chip 10 may be inner lead-bonded to a TAB tape 20. The inner lead-bonded portion may be sealed using a liquid molding compound 30 through an underfill process.

The semiconductor chip 10 may have input pads 14 and output pads 16 formed on the active surface 12 thereof. The semiconductor chip 10 may have increasingly finer pitch as the number of the input/output pads 14 and 16 increases. The semiconductor chip 10 may be an edge-pad type semiconductor chip, on which the input/output pads 14 and 16 are arranged along the edges. The input pads 14 may be larger in size and pitch than the output pads 16. This may prevent faults due to static electricity between the input pads 14. The input pads 14 may include pads for power and pads for grounding.

The TAB tape 20 may include a base film 21, wiring patterns 23 and sprocket holes 29. The base film 21 may be where the semiconductor chip 10 may be mounted. The wiring patterns 23 may be formed on the base film 21. The sprocket holes 29 may be arranged along the edges of the base film 21 at predetermined intervals. The wiring patterns 23 may include input terminal patterns 25 and output terminal patterns 27. The input terminal patterns 25 may extend to one side of the base film 21 relative to the semiconductor chip 10. The output terminal patterns 27 may extend to the other side of the base film 21 relative to the semiconductor chip 10. Ends of the input terminal patterns 25 and the output terminal patterns 27 may extend parallel to the arrangement of sprocket holes 29.

One end of each input terminal pattern 25a may be inner lead-bonded to the input pads 14a for power or for grounding and the other ends may be combined for power or for ground, respectively.

The trend of semiconductor products is toward miniaturization, high-speed, multi-function and high-performance. Reduced overall size of a semiconductor chip as well as the increased number and reduced pitch of input/output pads serve this trend. Conventionally, formation of input/output pads has been confined to a peripheral area of a semiconductor chip. The number of input/output pads which can be placed on the semiconductor chip may be limited. Excessive reduction of pitch of input pads may cause faults due to static electricity between the input pads. These factors may limit potential size reduction in a semiconductor chip.

The increased number of input/output pads may lead to the increased size of a semiconductor chip. This may result in a reduced number of semiconductor chips obtainable from a single wafer.

Further, the increased number of input/output pads may lead to finer pitch wiring patterns or increased size of a TAB tape. This may result in increased manufacturing costs of a TAB tape.

As a result, the fine pitch of wiring patterns may require a high-precision TAB package manufacturing process. This may result in reduced productivity of a TAB package.

SUMMARY OF THE INVENTION

An example embodiment of the present invention allows a semiconductor chip of reduced size and increased number of input/output pads at a finer pitch.

Another example embodiment of the present invention is a TAB package allowing increased number of input/output pads without increased manufacturing costs and with improved productivity.

According to an example embodiment of the present invention, a semiconductor chip for a TAB package may have an active surface including a connection area. The connection area may be formed in a portion of a peripheral area of the semiconductor chip. The semiconductor chip may include a plurality of output pads and a plurality of input pads. The output pads may be arranged in the peripheral area of the active surface of the semiconductor chip. The input pads may be arranged in a central area of the active surface of the semiconductor chip.

The input pads may be connected to wiring patterns of a TAB passing over the connection area.

The active surface may be formed of a rectangle including two relatively longer sides. The connection area may be formed at one of the longer sides.

The input pads may be arranged within the enclosure of the output pads. The input pads may be arranged adjacent to the output pads as positioned at the second longer side, e.g., opposite the connection area. The input pads may be arranged parallel to the longer sides.

The connection area may be positioned at the center of the longer side. The input pads may be arranged symmetrically relative to the connection area.

The semiconductor chip may further include a plurality of dummy pads formed in the connection area.

The dummy pads may be formed corresponding to the size and pitch of the output pads. The dummy pads may be formed corresponding to the number of the input pads.

The input/output pads may have metal bumps. The dummy pads may have dummy metal bumps.

According to another example embodiment of the present invention, a TAB package including the above-described semiconductor chip may comprise a semiconductor chip and a TAB tape. The semiconductor chip may have an active surface with a connection area. The connection area may be formed in a portion of a peripheral area of the semiconductor chip. The semiconductor chip may include a plurality of output bumps and a plurality of input bumps. The output bumps may be arranged in the peripheral area of the active surface of the semiconductor chip. The input bumps may be arranged in a central area of the active surface of the semiconductor chip. The TAB tape may have wiring patterns. The wiring patterns may include output terminal patterns connected to the output bumps and may include input terminal patterns connected to the input bumps. The input terminal patterns may extend over the connection area.

The TAB tape may include a base film having the wiring patterns. One end of the output terminal patterns may be connected to the output bumps of the semiconductor chip. The other end of the output terminal patterns may extend to a first side of the base film. One end of the input terminal patterns may be connected to the input bumps of the semiconductor chip. The other end of the input terminal patterns may extend to a second side of the base film via the connection area.

The input pads may include at least one input pad for power and at least one input pad for ground. Input terminal patterns connected to input pads for power may be combined into one input terminal pattern. Input terminal patterns connected to input pads for ground may be combined into one input terminal pattern.

BRIEF DESCRIPTION OF THE DRAWINGS

The example embodiments of the present invention will be readily understood with reference to the following detailed description thereof provided in conjunction with the accompanying drawings, wherein like reference numerals designate like structural elements.

Figure 1:
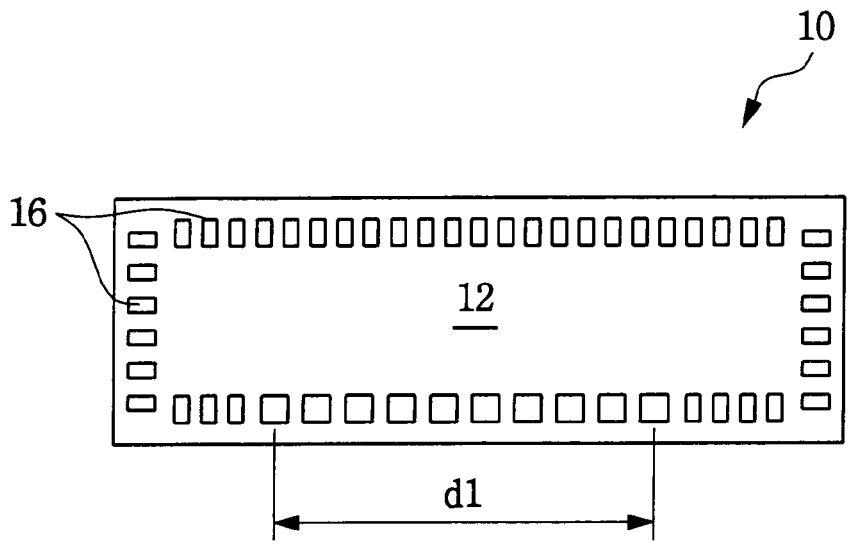
FIG. 1 is a plan view of a conventional semiconductor chip for a TAB package.
Figure 2:
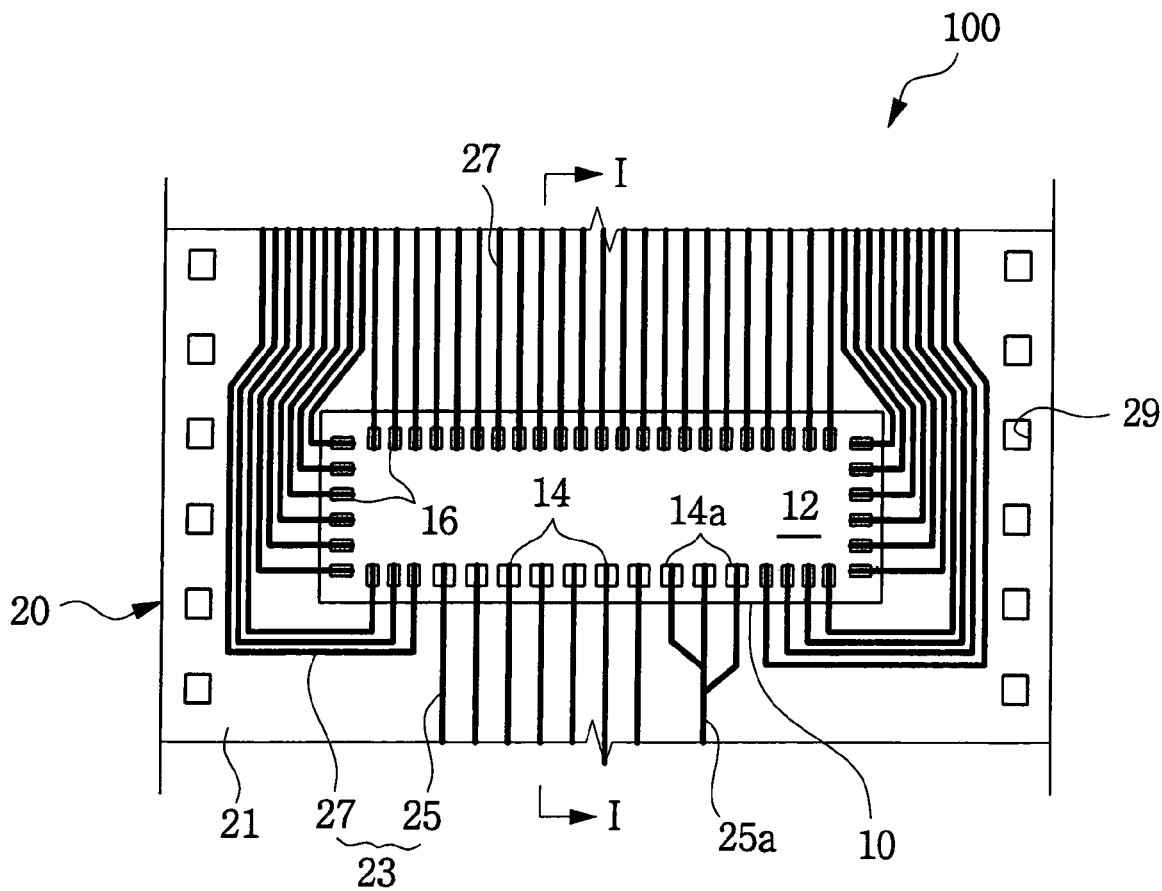
FIG. 2 is a plan view of a conventional TAB package including the semiconductor chip of FIG. 1.
Figure 3:
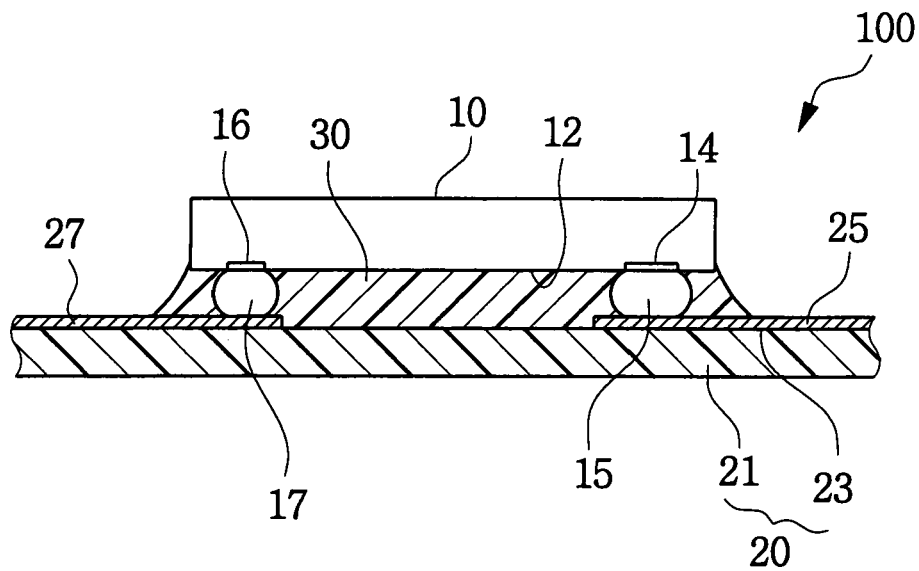
FIG. 3 is a cross-sectional view taken along the line I-I of FIG. 2.

These drawings are for illustrative purposes only and are not drawn to scale. The spatial relationships and relative sizing of the elements illustrated in the various embodiments may have been reduced, expanded or rearranged to improve the clarity of the figures with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION OF THE EXAMPLE EMBODIMENTS

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the present invention. Like reference numerals are used for like and corresponding parts of the various drawings.

Figure 4:
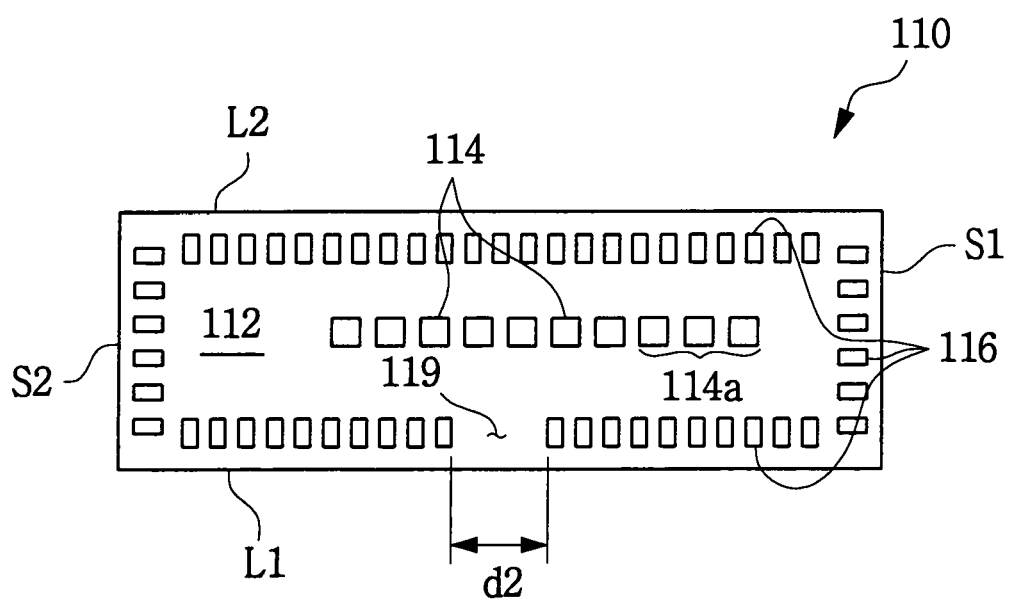
FIG. 4 is a plan view of a semiconductor chip for a TAB package in accordance with an example embodiment of the present invention.
Figure 5:
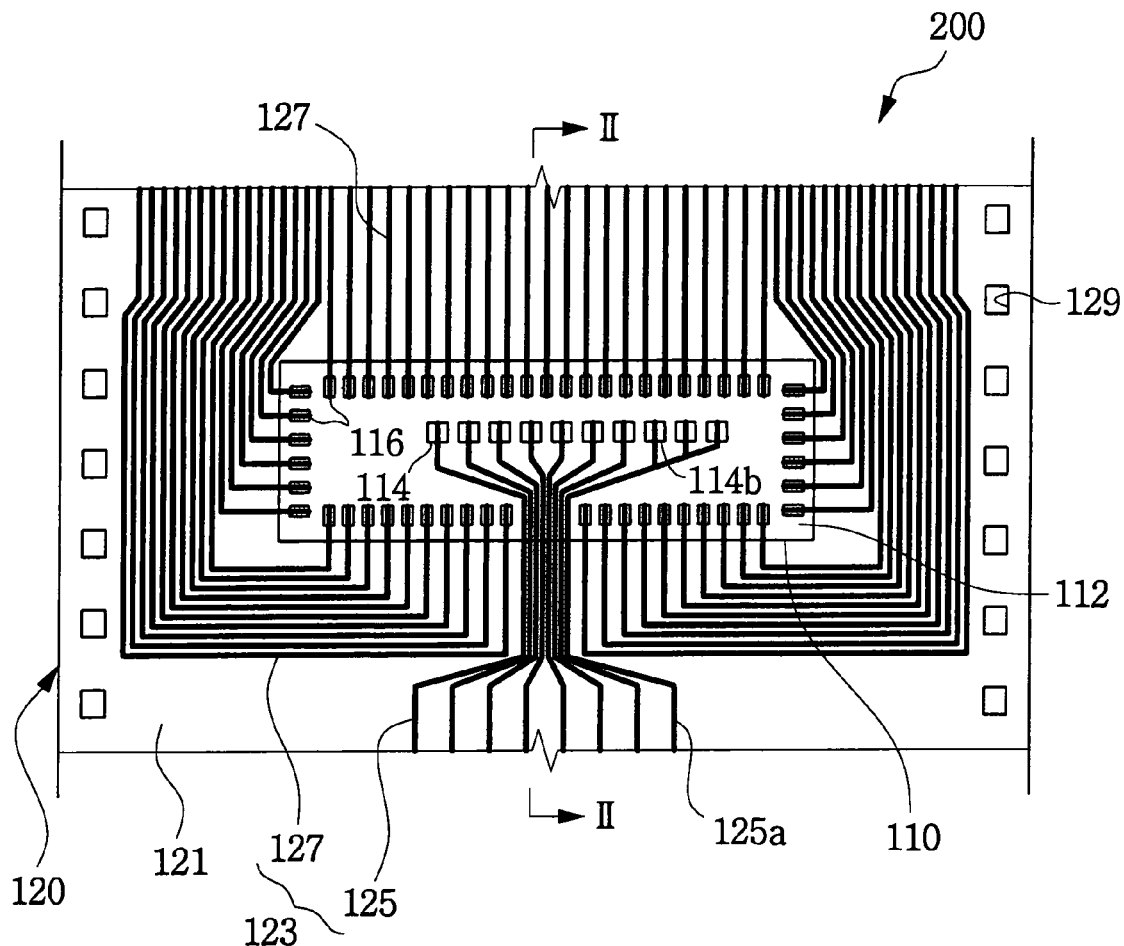
FIG. 5 is a plan view of a TAB package including the semiconductor chip of FIG. 4.
Figure 6:
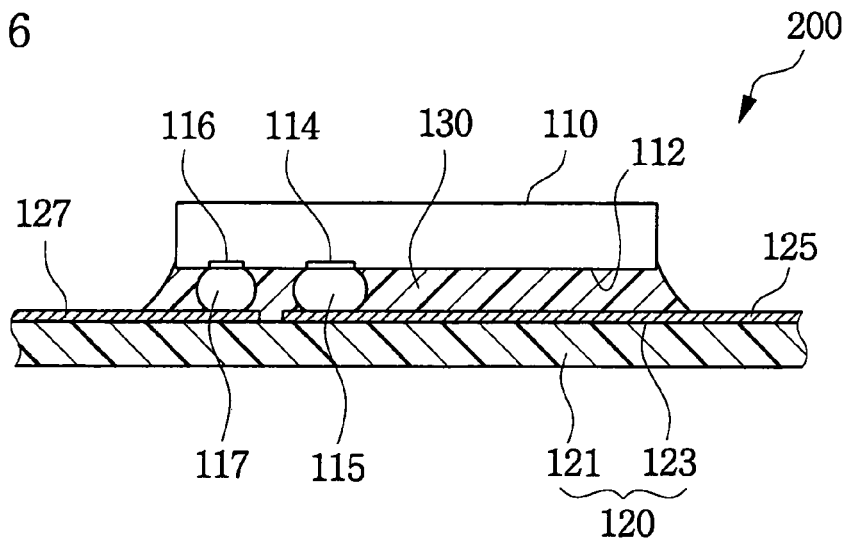
FIG. 6 is a cross-sectional view taken along the line II-II of FIG. 5.

FIG. 4 is a plan view of a semiconductor chip 110 for a TAB package in accordance with a first embodiment of the present invention. FIG. 5 is a plan view of the TAB package 200 having the semiconductor chip 110 of FIG. 4. FIG. 6 is a cross-sectional view taken along the line of II-II of FIG. 5.

Referring to FIGS. 4 through 6, the TAB package 200 may be a COB package. The TAB package 200 includes the semiconductor chip 110 and a TAB tape 120 having wiring patterns 123. The semiconductor chip 110 may be inner lead-bonded to the TAB tape 120. The semiconductor chip 110 includes an active surface 112 with input pads 114 and output pads 116 formed thereon. The output pads 116 may be formed in a peripheral area of the active surface 112. The input pads 114 may be formed in a central area of the active surface 112. The input pads 114 may have input metal bumps 115 and the output pads 116 may have output metal bumps 117. The wiring patterns 123 may be simultaneously inner lead-bonded to the input/output pads 114 and 116 through the metal bumps 115 and 117, respectively. The inner lead-bonded portion may be sealed using a liquid molding compound 130 through an underfill process.

The active surface 112 of the semiconductor chip 110 may be formed of a rectangle with two relatively longer opposing sides. A peripheral connection area 119 formed on a portion of the active surface 112 does not include the output pads 116. The output pads 116 may be formed in the remaining peripheral area of the active surface 112, e.g., except for the connection area 119. The input pads 114 may be formed within the enclosure of the output pads 116, e.g., a central area of surface 112. The input pads may be inner lead-bonded to the wiring patterns 123 which may pass over the connection area 119.

The semiconductor chip 110 of the present invention may be characterized by the input pads 114 formed in the central area of the active surface 112, instead of in the peripheral area.

Therefore, the number and pitch of the output pads 116 that can be formed in the peripheral area of the active surface 112 may be increased.

The connection area 119 may correspond to an input pad area of a conventional semiconductor chip. The width (d2) of the connection area 119 may be smaller than the width (d1 in FIG. 1) of the conventional input pad area, because the width of the wiring patterns 123 connected to the input pads 114 may be smaller than that of the conventional input pad area.

The size of the semiconductor chip 110 may be reduced to an extent of the difference of width between the connection area 119 and the conventional input pad area. Alternatively, the number of the output pads 116 may be increased by forming the output pads 116 on an area corresponding to the difference of width between the connection area 119 and the conventional input pad area.

Further, the number and pitch of the input pads 114 may be increased. The input pads 114 may be formed in the central chip surface 112 area, i.e., a larger area than the conventional peripheral input pad area. The pitch or the number of the input pads 114 may be increased. Therefore, this may reduce faults due to static electricity arising between the input pads 114.

The connection area 119 may be positioned at a first longer side L1, preferably at the center of longer side L1. The input pads 114 and the wiring patterns 123 connected to the input pads 114 may be arranged symmetrically relative to the connection area 119.

The input pads 114 may be formed adjacent to the output pads 116 positioned at the second longer side L2, e.g., opposite to the first longer side L1. This may establish a stable bonding pitch of the wiring patterns 123 which pass over the connection area 119 and extend radially to the input pads 114. Although this example embodiment shows the input pads 114 arranged along the second longer side L2, the input pads 114 may be arranged along at least one side, except for the connection area 119.

The input pads 114 may be arranged parallel to the longer side L1, preferably symmetrically relative to the connection area 119.

Although this example embodiment shows a single line of the input pads 114 and a single line of the output pads 116, any of the input pads 114 or the output pads 116 may be arranged in at least two lines. In this case, the pads may be arranged in a zigzag pattern.

The TAB tape 120 may have a base film 121 of polyimide and the wiring patterns 123 of a Cu foil. The wiring patterns 123 may include input terminal patterns 125 and output terminal patterns 127. The input terminal patterns 125 may be inner lead-bonded to the input pads 114 of the semiconductor chip 110 through the metal bumps 115. The output terminal patterns 127 may be inner lead-bonded to the output pads 116 through the metal bumps 117.

One end of the output terminal patterns 127 may be connected to the output pads 116. The other end of the output terminal patterns 127 may extend to one side of the base film 121. One end of the input terminal patterns 125 may be connected to the input pads 114. The other end of the input terminal patterns 125 may extend to the other side of the base film 121, passing over the connection area 119.

The connection area 119 may face the other side of the base film 121 so that the input terminal patterns 125 and the output terminal patterns 127 may not overlap. The output terminal patterns 127 connected to the output pads 116 positioned at longer side L1 and both shorter sides S1 and S2 of the semiconductor chip 110, may extend toward one side of the base film 121. For example, the output terminal patterns 127 connected to the output pads 116 positioned at the longer side L1 may take the shape of an English letter "U". The output terminal patterns 127 connected to the output pads 116 positioned at the shorter sides S1 and S2 may take the shape of an English letter "L".

The input terminal patterns 125a connected to the input pads 114a may be combined on the active surface 112 of the semiconductor chip 110. The number of the input terminal patterns 125 drawn over the connection area 119 may be thereby reduced. Thus, the reduced number of the input terminal patterns 125 may lead to the reduced width (d2) of the connection area 119. The peripheral area of the active surface 112 may be increased, corresponding to the reduced width (d2) of the connection area 119. The increased peripheral area of the active surface 112 may increase the pitch between the output pads 116. The input terminal patterns connected to the input pads for power may be combined. The input terminal patterns connected to the input pads for grounding may be combined.

In accordance with the first embodiment of the present invention, the semiconductor chip 110 may be mounted on the TAB tape 120 and the semiconductor chip 110 may be compressed onto the TAB tape 120 using a bonding tool. Therefore, the semiconductor chip 110 may be inner lead-bonded to the TAB tape 120.

When the semiconductor chip 110 is compressed, e.g., during inner lead bonding, mechanical stresses may concentrate on the connection area 119 where the input/output bumps are not necessarily present. The semiconductor chip 110 may then warp at the connection area 119, or the metal bumps 117 adjacent to the connection area 119 may be compressed relatively more severely.

To solve this problem, however, a TAB package can include dummy pads and dummy metal bumps.

Figure 7:
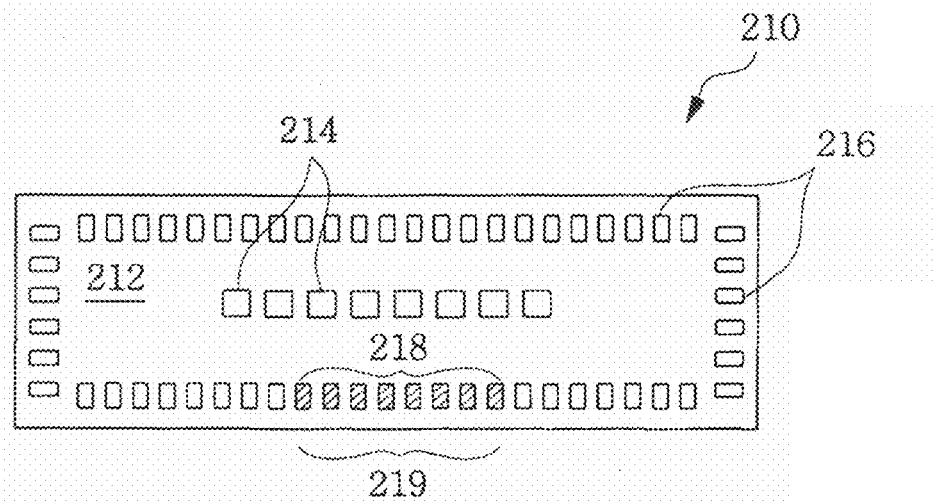
FIG. 7 is a plan view of a semiconductor chip for a TAB package in accordance with another example embodiment of the present invention.
Figure 8:
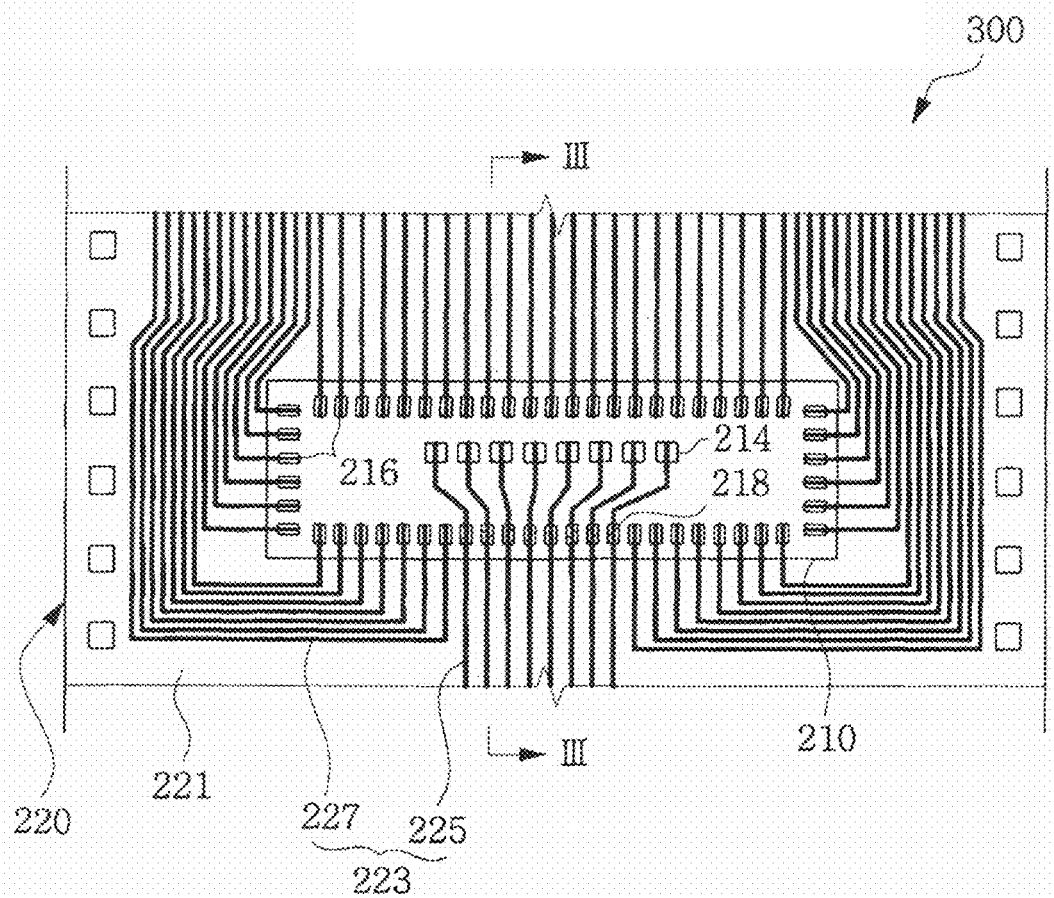
FIG. 8 is a plan view of a TAB package including the semiconductor chip of FIG. 7.
Figure 9:
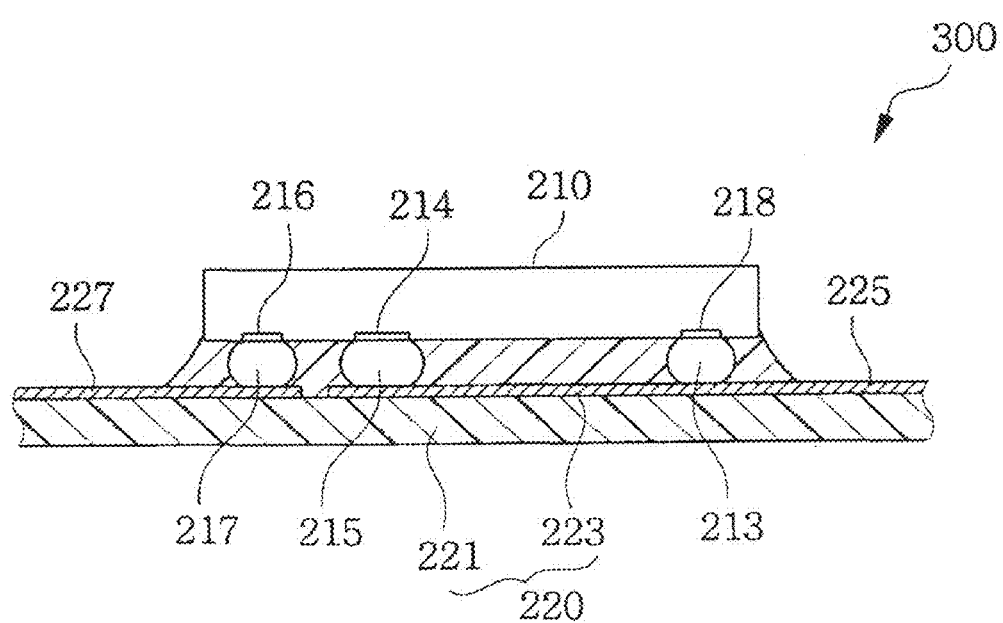
FIG. 9 is a cross-sectional view taken along the line III-III of FIG. 8.

FIG. 7 is a plan view of a semiconductor chip 210 for the TAB package according to a second embodiment of the present invention. FIG. 8 is a plan view of the TAB package 300 including the semiconductor chip 210 of FIG. 7. FIG. 9 is a cross-sectional view taken along the line of III-III of FIG. 8.

Referring to FIGS. 7 through 9, the TAB package 300 includes dummy pads 218 formed in a connection area 219 and includes metal bumps 213 formed on the dummy pads 218. The metal bumps 213 may be hereinafter referred to as dummy bumps. As a result, the semiconductor chip 210 receives substantially uniform pressure during an inner lead-bonding process.

Although this example embodiment shows the dummy pads 218 having the same size and pitch as output pads 216, the dummy pads 218 may be not limited in this regard. The size and pitch of the dummy pads 218 may be sized within the range of a stable bonding to input terminal patterns 225.

The dummy bumps 213 may support the input terminal patterns 225 connected to input bumps 215. The dummy bumps 213 may be not substantially electrically connected to the semiconductor chip 210. However, the dummy bumps 213 may be electrically connected to the semiconductor chip 210, if necessary in a given implementation.

Although this example embodiment shows the dummy pads 218 having the same quantity as the input pads 214, the dummy pads 218 need not be limited in this regard.

The TAB package 300 of this example embodiment may have the output bumps 217 and the dummy bumps 213 uniformly arranged in the peripheral area of the active surface 212 of the semiconductor chip 210. Bonding tool pressure is thereby more uniformly transmitted to the semiconductor chip 210 during an inner lead-bonding process. Therefore, reliable inner lead-bonding is accomplished. The input terminal patterns 225 may be simultaneously bonded to the dummy bumps 213 and the input bumps 215.

In accordance with the example embodiments of the present invention, a semiconductor chip may have output pads formed on the peripheral area of the active surface and input pads formed in the central area of the active surface. The size of the semiconductor chip may be reduced, or the number of the input/output pads may be increased.

An increased number of input/output pads may not require an increase of manufacturing costs of a TAB tape. Therefore, the productivity of a TAB package is improved.

Further, input terminal patterns connected to the input pads may be combined on the active surface of the semiconductor chip. The number of the input terminal patterns drawn over a connection area may thereby be reduced. The reduced number of the input terminal patterns may lead to the reduced width of the connection area. The peripheral area of the active surface may be increased, corresponding to the reduced width of the connection area. The increased peripheral area of the active surface allows increased pitch between the output pads.

Although example, non-limiting embodiments of the present invention have been described in detail hereinabove, it should be understood that many variations and/or modifications of the basic inventive concepts taught herein, which may appear to those skilled in the art, will still fall within the spirit and scope of the present invention as defined in the appended claims.

What is claimed is:

1. A TAB (Tape Automated Bonding) package comprising:
a flexible film substrate;
a plurality of wiring patterns including dedicated input patterns and dedicated output patterns disposed on the film substrate; and
a semiconductor chip disposed on the film substrate, the semiconductor chip comprising:
a major surface comprising two long sides and two short sides;
a plurality of dedicated output bumps disposed on a peripheral area along the two long sides, the dedicated output bumps being coupled to corresponding dedicated output patterns; and
a plurality of dedicated input bumps formed on the major surface and disposed between the dedicated output bumps, the dedicated input bumps being coupled to corresponding dedicated input patterns;
wherein the dedicated input patterns pass over a first of the two long sides and extend toward a second of the two long sides as the dedicated input patterns run from an area outside the semiconductor chip to an area over the semiconductor chip,
wherein at least one of the dedicated input patterns is connected to at least two dedicated input bumps, and
wherein, in an area confined to above the major surface, a part of one the dedicated input patterns extends between and connects to at least two dedicated input bumps.

2. The TAB package of claim 1, wherein the major surface comprises a connection area provided along the first of the two long sides, the connection area being devoid of signal and power connections to an internal portion of the semiconductor chip other than through patterns passing through the connection area to bumps outside the connection area.

3. The TAB package of claim 2, wherein the dummy bump is disposed in the connection area.

4. The TAB package of claim 1, wherein the major surface includes a central area enclosed by the peripheral area and the dedicated input patterns extend to the central area of the major surface.

5. The TAB package of claim 4, wherein the dedicated input patterns extend across a center line of the semiconductor chip, the center line being parallel to the two long sides of the major surface and passing through a center of the major surface.

6. The TAB package of claim 1, wherein, at least within a portion of the major surface, the dedicated input bumps are symmetric with respect to a first center line of the semiconductor chip parallel to the two short sides of the major surface, and asymmetric with respect to a second center line of the semiconductor chip parallel to the two long sides of the major surface.

7. The TAB package of claim 1, wherein at least two dedicated input bumps are power bumps.

8. The TAB package of claim 1, wherein at least two dedicated input bumps are ground bumps.

9. A TAB (Tape Automated Bonding) package comprising:
a flexible film substrate;
a plurality of wiring patterns including dedicated input patterns and dedicated output patterns disposed on the film substrate;
a semiconductor chip mounted on the film substrate, the semiconductor chip having a major surface including two long sides and two short sides;
a plurality of dedicated output bumps disposed on a peripheral area of the major surface and along at least one long side of the major surface, the dedicated output bumps being coupled to a corresponding dedicated output pattern;
a dummy bump disposed along one long side of the major surface; and
a plurality of dedicated input bumps, including a first dedicated input bump, disposed on the major surface, the dedicated input bumps being coupled to the dedicated input patterns,
wherein the dedicated input patterns includes a first dedicated input pattern, the first dedicated input pattern being coupled to the dummy bump and the first dedicated input bump.

10. The TAB package of claim 9, wherein the dummy bump is electrically disconnected from the semiconductor chip so that the connection of the dummy bump to the semiconductor chip does not transmit a signal or power to the semiconductor chip.

11. The TAB package of claim 9, wherein the dummy bump is disposed on the peripheral area.

12. The TAB package of claim 9, wherein the dummy bump and the dedicated output bumps are disposed along a same long side.

13. The TAB package of claim 12, wherein the dummy bump is disposed between the dedicated output bumps.

14. The TAB package of claim 9, further comprising:
a plurality of dummy bumps disposed at the peripheral area of the major surface.

15. The TAB package of claim 14, wherein a pitch of the dummy bumps is smaller than a pitch of the dedicated input bumps.

16. The TAB package of claim 9, further comprising a plurality of dummy bumps positioned within at least a portion of the dedicated output bumps so that bumps comprising the combination of the plurality of dummy bumps and at least a portion of the dedicated output bumps are regularly spaced.

17. A TAB (Tape Automated Bonding) package comprising:
a tape substrate;
a plurality of leads formed on the tape substrate;

a semiconductor chip including a plurality of terminals on a major surface of the semiconductor chip, the semiconductor chip being mounted to the tape substrate and connected to the plurality of leads via the plurality of terminals;

wherein the plurality of terminals include at least a first group of terminals and a second group of terminals, the first group of terminals being spaced apart at a first pitch, and the second group of terminal being spaced apart at a second pitch different from the first pitch, wherein the second group of terminals includes at least one dummy terminal, wherein the second group of terminals includes two subgroups of second terminals and the at least one dummy terminal, wherein the at least one dummy terminal is positioned between the two subgroups of second terminals so that the second pitch is provided for all of the second terminals, wherein the terminals of the first group of terminals are consecutively arranged, the terminals of the second group of terminals are consecutively arranged, and the terminals of each of the two subgroups of second terminals are consecutively arranged.

18. The TAB package of claim 17, wherein the second pitch is smaller than the first pitch.

19. The TAB package of claim 18, wherein the first group of terminals are dedicated input terminals provided in a center region of the semiconductor chip, and the two subgroups of second terminals are dedicated output terminals provided along at least one side of the semiconductor chip.

20. The TAB package of claim 17, wherein the terminals are bumps.

* * * * *

UNITED STATES PATENT AND TRADEMARK OFFICE
CERTIFICATE OF CORRECTION

PATENT NO. : 7,732,933 B2 Page 1 of 1
APPLICATION NO. : 11/971848
DATED : June 8, 2010
INVENTOR(S) : Ye-Chung Chung It is certified that error appears in the above-identified patent and that said Letters Patent is hereby corrected as shown below:

Column 7, line 54   Delete: "part of one the"
                    Insert: --part of one of the--

Column 7, line 62   Delete: "the dummy bump"
                    Insert: --a dummy bump--

Signed and Sealed this

Thirty-first Day of August, 2010

David J. Kappos
*Director of the United States Patent and Trademark Office*